United States Patent
Nakabayashi et al.

(10) Patent No.: US 9,777,403 B2
(45) Date of Patent: Oct. 3, 2017

(54) SINGLE-CRYSTAL SILICON CARBIDE AND SINGLE-CRYSTAL SILICON CARBIDE WAFER

(75) Inventors: Masashi Nakabayashi, Tokyo (JP); Tatsuo Fujimoto, Tokyo (JP); Masakazu Katsuno, Tokyo (JP); Hiroshi Tsuge, Tokyo (JP)

(73) Assignee: NIPPON STEEL & SUMITOMO METAL CORPORATION, Chiyoda-Ku, Tokyo (JP)

( * ) Notice: Subject to any disclaimer, the term of this patent is extended or adjusted under 35 U.S.C. 154(b) by 903 days.

(21) Appl. No.: 12/998,357

(22) PCT Filed: Oct. 14, 2009

(86) PCT No.: PCT/JP2009/068084
§ 371 (c)(1),
(2), (4) Date: Apr. 11, 2011

(87) PCT Pub. No.: WO2010/044484
PCT Pub. Date: Apr. 22, 2010

(65) Prior Publication Data
US 2011/0206929 A1    Aug. 25, 2011

(30) Foreign Application Priority Data
Oct. 15, 2008    (JP) .................. 2008-265926

(51) Int. Cl.
*C30B 29/36* (2006.01)
*C30B 23/00* (2006.01)
(Continued)

(52) U.S. Cl.
CPC ............. *C30B 29/36* (2013.01); *C30B 23/00* (2013.01); *C30B 25/00* (2013.01); *C30B 23/025* (2013.01); *Y10T 428/2918* (2015.01)

(58) Field of Classification Search
CPC ......... C30B 25/00; C30B 23/00; C30B 29/36; C30B 23/02; C30B 23/002;
(Continued)

(56) References Cited

U.S. PATENT DOCUMENTS 5,463,978 A * 11/1995 Larkin et al. .................. 117/89
6,734,461 B1 * 5/2004 Shiomi et al. .................. 257/77
(Continued)

FOREIGN PATENT DOCUMENTS

EP    1491662    12/2004
JP    9-157091    6/1997
(Continued)

OTHER PUBLICATIONS

Rost et al., "High Nitrogen Doping During Bulk Growth of SiC", Silicon Carbide, W. J. Choyke et al., eds., pp. 163-178, Springer-Verlag Berlin Heidelberg (2004).*
(Continued)

*Primary Examiner* — Scott R Walshon
(74) *Attorney, Agent, or Firm* — Birch, Stewart, Kolasch & Birch, LLP

(57) ABSTRACT

A single-crystal silicon carbide and a single-crystal silicon carbide wafer of good-quality are disclosed that are low in dislocations, micropipes and other crystal defects and enable high yield and high performance when applied to a device, wherein the ratio of doping element concentrations on opposite sides in the direction of crystal growth of the interface between the seed crystal and the grown crystal is 5 or less and the doping element concentration of the grown crystal in the vicinity of the seed crystal is $2\times10^{19}$ cm$^{-3}$ to $6\times10^{20}$ cm$^{-3}$.

11 Claims, 1 Drawing Sheet

(51) Int. Cl.
*C30B 25/00* (2006.01)
*C30B 23/02* (2006.01)

(58) Field of Classification Search
CPC ......... Y10T 428/2982; Y10T 117/1024; Y10T 428/2918; C23C 16/325; C23C 16/52
USPC ... 117/84, 88, 89, 93, 94, 97, 911, 951, 103, 117/109; 428/698, 409, 367; 438/505; 257/77
See application file for complete search history.

(56) References Cited

U.S. PATENT DOCUMENTS

| | | | | |
|---|---|---|---|---|
| 7,135,072 | B2* | 11/2006 | Mueller | 117/84 |
| 7,314,521 | B2* | 1/2008 | Powell et al. | 117/109 |
| 7,601,441 | B2* | 10/2009 | Jenny et al. | 428/698 |
| 2002/0019117 | A1* | 2/2002 | Nagasawa | 438/505 |
| 2006/0118037 | A1 | 6/2006 | Powell et al. | |
| 2007/0000432 | A1* | 1/2007 | Oyanagi | 117/84 |

FOREIGN PATENT DOCUMENTS

| | | | |
|---|---|---|---|
| JP | 10-67600 | | 3/1998 |
| JP | 10067600 | A * | 3/1998 |
| JP | 2003-119097 | | 4/2003 |
| JP | 2006-290635 | | 10/2006 |
| JP | 2006290635 | A * | 10/2006 |
| JP | 2008-1532 | | 1/2008 |
| JP | 2008001532 | A * | 1/2008 |

OTHER PUBLICATIONS

Rost et al., "Influence of Nitrogen Doping on the Properties of 4H—SiC Single Crystals Grown by Physical Vapor Transport", Journal of Crystal Growth vol. 257, pp. 75-83 (2003).*
Ohtani et al., "Investigation of Heavily Nitrogen-Doped n+ 4H—SiC Crystals Grown by Physical Vapor Transport", Journal of Crystal Growth vol. 311, pp. 1475-1481 (2009).*
International Search Report dated Nov. 17, 2009 issued in corresponding PCT Application No. PCT/JP2009/068084.
Yu. M. Tairov and V. F. Tsvetkov, "General Principles of Growing Large-Size Single Crystals of Various Silicon Carbide Polytypes," Journal of Crystal Growth, vol. 52 (1981) pp. 146-150.
P. G. Neudeck et al., "Performance Limiting Micropipe Defects in Silicon Carbide Wafers," IEEE Electron Device Letters, vol. 15 (1994) pp. 63-65.
H. Lendenmann, et al., "High-Power SiC Diodes: Characteristics, Reliability and Relation to Material Defects," Materials Science Forum, vols. 389-393 (2002), pp. 1259-1264.
A. V. Samant, et al., "Effect of Test Temperature and Strain Rate on the Yield Stress of Monocrystalline 6H—SiC," Physica Status Solidi (A), vol. 166 (1998), 1, pp. 155-169.
P. Wu, et al., "Defect evolution during growth of SiC crystals," Journal of Crystal Growth, vol. 310 (2008) pp. 1804-1809.
C. Basceri, et al., "Growth of Micropipe-Free Single Crystal Silicon Carbide (SiC) Ingots via Physical Vapor Transport (PVT)," Materials Science Forum, vols. 527-529 (2006) pp. 39-42.
European Search Report, dated Nov. 7, 2011, issued in corresponding European Application No. 09820658.4.
Schmitt et al: "Polytype stability and defects in differently doped bulk SiC", Journal of Crystal Growth, Elsevier, Amsterdam, NL, vol. 310, No. 5, Dec. 4, 2007, pp. 966-970.
Millan J et al: "Recent developments in SiC power devices and related technology", Microelectronics, 2004. 24th International Conference on NIS, Serbia and Montenegro, May 16-19, 2004, Piscataway, NJ, USA, IEEE, vol. 1, May 16, 2004, pp. 23-30.
Adrian R Powell et al: "SiC Materials-Progress, Status, and Potential Roadblocks", Proceedings of the IEEE, IEEE. New York, US, vol. 90, No. 6, Jun. 1, 2002.
Shiomi H et al: "Crystal growth of micropipe free 4H—SiC on 4H—SiC {033@?8} seed and high-purity semi-insulating 6H—SiC", Journal of Crystal Growth, Elsevier, Amsterdam, NL, vol. 292. No. 2, Jul. 1, 2006, pp. 188-191.
Chung, et al., "Direct observation of basal-plane to threading-edge dislocation conversion in 4H—SiC epitaxy," J. Appl. Phys., 109 (2011).
D. Hull and D. J. Bacon, "Introduction to Dislocations" 4th ed. Elsevier, 2001, pp. 84-91.
D.J. Larkin, "SiC Dopant Incorporation Control Using Site-Competition CVD," Phys. Stat. Sol. (b), 202, pp. 305-320, 1997.

* cited by examiner

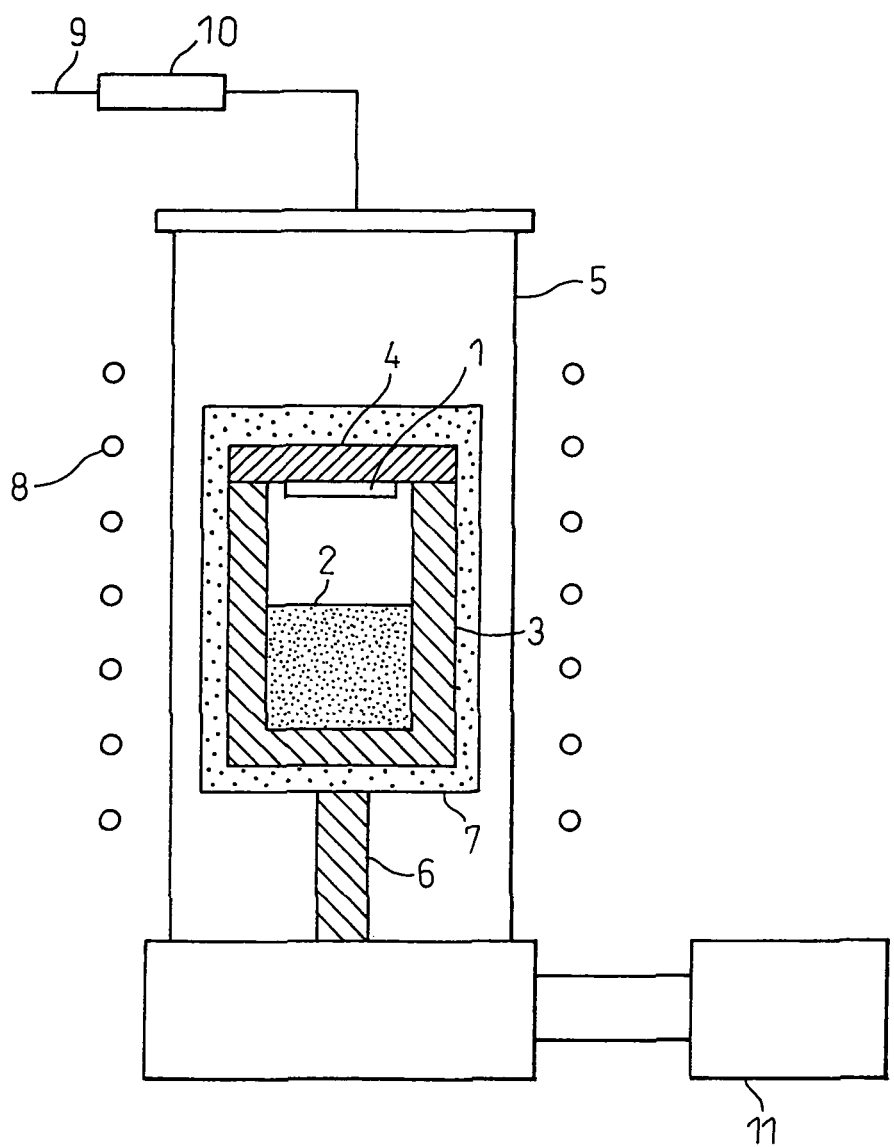

SINGLE-CRYSTAL SILICON CARBIDE AND SINGLE-CRYSTAL SILICON CARBIDE WAFER

This application is a national stage application of International Application No. PCT/JP2009/068084, filed 14 Oct. 2009, which claims priority to Japanese Application No. 2008-265926, filed 15 Oct. 2008, which is incorporated by reference in its entirety

FIELD OF THE INVENTION

This invention relates to single-crystal silicon carbide of high crystal quality having few dislocations and other crystal defects, and a single-crystal silicon carbide wafer.

BACKGROUND ART

Silicon carbide (SiC) is a wide-bandgap semiconductor having a broad forbidden band width of 2.2 to 3.3 eV. Owing to its outstanding physical and chemical properties, SiC has become a focus of research and development for its potential as an environmentally rugged semiconductor material. In recent years, moreover, SiC has attracted increasing attention as a material for short wavelength optical devices in the blue-to-UV spectral region, high-frequency electronic devices, high-voltage electronic devices, high output electronic devices, and the like. Although R&D is being aggressively pursued with regard to such applications, production of large-diameter single-crystal silicon carbide of high quality has so far proved to be difficult to achieve, and this has thwarted practical use of SiC devices.

Single-crystal SiC of a size usable for fabrication of semiconductor devices has up to now been conducted on a laboratory scale using, for example, the sublimation recrystallization process (Lely process). However, the single crystal obtained by this method is of small area, and its dimensions and shape are difficult to control. Moreover, control of the crystal polytype and doping carrier concentration of the SiC is not easy either. On the other hand, cubic single-crystal SiC is being produced by heteroepitaxial growth, i.e., growth on a substrate of a different type like silicon (Si), using chemical vapor deposition (CVD). Although large-area single crystal can be obtained by this process, high-quality single-crystal SiC cannot be obtained because, among other reasons, the approximately 20% lattice-mismatch between the SiC and Si invariably causes growth of SiC single crystal containing many defects (~$10^7$/cm$^2$).

The modified Lely process, which conducts sublimation recrystallization using a single-crystal SiC wafer as a seed, was developed to overcome these problems (Non Patent Literature 1). The modified Lely process makes it possible to grow single-crystal SiC while controlling its polytype (6H, 4H, 15R and other polytypes), shape, and carrier type and concentration.

Currently, 51 mm (2-inch) to 100 mm single-crystal SiC wafers are being cut from single-crystal SiC produced by the modified Lely process and used, for example, to fabricate devices in the power electronics field. In most cases, however, the crystals are observed to contain micropipes (hollow hole-like defects extending in the longitudinal direction of the crystal) at a density of up to around several tens cm$^{-2}$ and dislocation defects at a density on the order of $10^4$ to $10^5$ cm$^{-2}$. As pointed out, for example, in Non Patent Literature 2, and Non Patent Literature 3, these defects cause leakage current and other problems in a fabricated electronic device.

Crystal defect reduction is considered one of the most important issues in the application of single-crystal SiC in devices.

Numerous reports have been published on research into micropipes, which are viewed as the typical defect of single-crystal SiC. The micropipes in the grown crystal are often ones inherited from micropipes present in the seed crystal. Although the average number of micropipes present in a single-crystal SiC wafer has declined with advances in crystal growth technology, a complete solution has not yet been found to the problem of the number of micropipes in the grown crystal being greater than in the seed crystal owing to new micropipes arising from starting points that are secondary phases such as foreign polytypes, polycrystal and the like included during crystal growth.

In recent years, the dislocation defects of single-crystal SiC have also become a major focus of attention. Although many aspects of the occurrence and propagation of dislocation defects in single-crystal SiC are not fully understood, the general situation can be summarized as follows.

Threading dislocations like threading screw and edge dislocations resemble micropipes in the point that they are often inherited by the grown crystals from ones present in the seed crystal from the start. Still, one property of single-crystal SiC is that dislocations whose slip plane is the basal plane ({0001})(basal plane dislocations) occur relatively easily during crystal growth. This is because in the modified Lely process, the classic method of producing single-crystal SiC, occurrence of thermal stress is substantially unavoidable and the critical sheer stress of the {0001} plane that is the main SiC slip plane is very small at high temperature (see, for example, Non Patent Literature 4). As the basal plane dislocation itself has a slip line substantially perpendicular to the growth direction, it does not propagate in the growth direction. But in the course of crystal growth, the basal plane dislocation may change to and be inherited as a threading dislocation having a slip line passing through in the growth direction ([0001]), which is thought to increase the dislocation density of the grown crystal.

As explained in the foregoing, although the quality of the grown crystal is strongly dependent on the quality of the seed crystal, it is also a fact that, even when the crystal is grown using high-quality single-crystal SiC as the seed crystal, the quality of the grown crystal is nevertheless often degraded by the occurrence of new crystal defects owing to inclusion of foreign polytypes and polycrystal during crystal growth, as well as to unavoidable thermal stress and other factors. Considerable research has been focused on the development of technologies for overcoming this problem and enabling stable production of high-quality single-crystal SiC.

For example, Patent Literature 1 teaches a method for stable growth of a desired polytype by adding a certain kind of dopant. This technology is aimed at stable production of 4H polytype by preferential nucleation under high C/Si ratio. The carbon/silicon element ratio (C/Si ratio) in the crystal is effectively increased during single-crystal SiC growth by adding nitrogen at carbon atom sites at an atomic number density of $5 \times 10^{18}$ cm$^{-3}$ or greater, preferably $5 \times 10^{19}$ cm$^{-3}$ or greater.

Patent Literature 2 teaches that, where N number (N=natural ordinal number not less than 3) of growth steps are incorporated and defined as nth growth steps (n=natural ordinal number between one and N, inclusive), the first growth step (n=1) uses a first seed crystal wherein a surface of an offset angle of ±20° or less from the {1-100} plane or a surface of an offset angle of ±20° or less from the {11-20} plane is exposed as a first growth surface on which single-crystal SiC is grown to prepare a first grown crystal, the intermediate growth steps n=2, 3 . . . , (N−1) each prepares from an (n−1)th seed crystal an nth seed crystal wherein the nth growth surface is a surface inclined from the (n−1)th growth surface by 45 to 90° and from the {0001} plane by 60 to 90° and grows single-crystal SiC on the nth growth surface of the nth seed crystal to prepare nth grown crystal, and the final growth step (n=N) prepares from the (N−1)th grown crystal a final seed crystal wherein a surface of an offset angle of ±20° or less from the {0001} plane of the (N−1)th grown crystal is exposed as a final growth surface and bulk SiC crystal is grown on the final growth surface of the final seed crystal, thereby establishing a method of producing high-quality single-crystal SiC with few micropipe defects, dislocation defects, stacking faults and the like.

On the other hand, the problems that have a major effect on the quality of the single-crystal SiC most often arise at the initial stage of crystal growth. Non Patent Literature 5, for example, report a phenomenon of heavy occurrence of dislocation defects at the very start of crystal growth, i.e., at the interface between the seed crystal and the grown crystal. In addition, it is known from Non Patent Literature 6, for example, that the probability of foreign polytype occurrence is high at the start of crystal growth.

Some of the defects occurring at the start of crystal growth disappear during the ensuing crystal growth, so that defect density decreases toward the latter half of the growth. But since some remain to the end of the crystal growth, the defect density of the grown crystal does not decrease below a certain level no matter how high the quality of the seed crystal used. Inhibition of crystal defect occurrence at the start of growth is therefore indispensable for realizing high single-crystal SiC quality.

Although the reasons for crystal defects occurring at the start of growth have not all been determined, one is probably that the thermal stress unavoidably produced in the modified Lely process is large at the interface between the seed crystal and the grown crystal. Moreover, recent studies have found that another major cause is the difference in doping element density between the seed crystal and the grown crystal.

The invention of Patent Literature 3 was made with focus on doping element concentration difference. This publication teaches a method of producing high-quality single-crystal silicon carbide by gradually increasing or gradually decreasing additive element concentration in the growth crystal within a predetermined range of concentration change from the same concentration as that of the seed crystal to a desired concentration, thereby inhibiting defect occurrence at the interface between the seed crystal and the grown crystal.

CITATION LIST

Patent Literature

PTL 1 Unexamined Patent Publication (Kokai) No. 9-157091
PTL 2 Unexamined Patent Publication (Kokai) No. 2003-119097
PTL 3 Unexamined Patent Publication (Kokai) No. 2006-290635

Non Patent Literature

NPL 1 Yu. M. Tairov and V. F. Tsvetkov, Journal of Crystal Growth, vol. 52 (1981) pp. 146-150
NPL 2 P. G. Neudeck, et al., IEEE Electron Device Letters, vol. 15 (1994) pp. 63-65
NPL 3 H. Lendenmann, et al., Materials Science Forum, vols. 389-393 (2002), pp. 1259-1264
NPL 4 A. V. Samant, et al., Physica Status Solidi (A), Vol. 166 (1998), 1, pp. 155-169
NPL 5 P. Wu, et al., Journal of Crystal Growth, vol. 310 (2008) pp. 1804-1809
NPL 6 C. Basceri, et al., Materials Science Forum, vols. 527-529 (2006) pp. 39-42

SUMMARY OF THE INVENTION

Problem to be Solved by the Invention

The method set out in Patent Literature 1 does not enable total avoidance of defect occurrence at the start of crystal growth, i.e., at the interface between the seed crystal and the grown crystal.

The same can be said of the method set out in Patent Literature 2. Even though the high-quality final seed crystal is used in the final Nth growth, the occurrence of defects at the start of the growth makes it impossible to produce crystal of a quality higher than that of the seed crystal.

The method of Patent Literature 3 is aimed at inhibiting defect occurrence at the start of growth. Even with the method of Patent Literature 3, however, the reduction of defect density is insufficient. Moreover, this method requires the doping element concentration of the grown crystal in the vicinity of the seed crystal to be matched to the doping element concentration of the seed crystal, and when this does not contribute adequately to stable growth of the desired polytype, the rate of foreign polytype occurrence may rise to degrade crystallinity.

The present invention was made in light of these circumstances and provides good-quality single-crystal SiC low in micropipe defects and dislocation defects, and a good-quality single-crystal silicon carbide wafer processed from the single crystal.

Means for Solving the Problem

The present invention is constituted as described below.

(1) A single-crystal silicon carbide comprising a seed crystal and a grown crystal grown on the seed crystal, wherein doping element concentration of the grown crystal at least in a region in the vicinity of the seed crystal is $2\times10^{19}$ $cm^{-3}$ to $6\times10^{20}$ $cm^{-3}$ and a ratio of higher to lower doping element concentrations on opposite sides of an interface between the seed crystal and the grown crystal (concentration of high concentration side crystal/concentration of low concentration side crystal) is 5 or less.

(2) A single-crystal silicon carbide according to (1), wherein the region in the vicinity of the seed crystal is a region of 0.5 mm or less thickness on the grown crystal side of the interface between the seed crystal and the grown crystal.

(3) A single-crystal silicon carbide according to (1) or (2), wherein the ratio of higher to lower doping element concentrations is 2 or less.

(4) A single-crystal silicon carbide according to any of (1) to (3), wherein the ratio of higher to lower doping element concentrations is 1.5 or less.

(5) A single-crystal silicon carbide according to any of (1) to (4), wherein the doping element concentration of the grown crystal in a region in the vicinity of the seed crystal is $5\times10^{19}$ $cm^{-3}$ to $6\times10^{20}$ $cm^{-3}$.

(6) A single-crystal silicon carbide according to any of (1) to (5), wherein the doping element concentration of the grown crystal in a region in the vicinity of the seed crystal is $1\times10^{20}$ cm$^{-3}$ to $6\times10^{20}$ cm$^{-3}$.

(7) A single-crystal silicon carbide according to any of (1) to (6), wherein the doping element is nitrogen.

(8) A single-crystal silicon carbide according to any of (1) to (7), wherein the principal polytype is 4H.

(9) A single-crystal silicon carbide according to any of (1) to (8), wherein total etch pit density caused by all types of dislocation observed in a wafer of an off-angle of 8° from the {0001} plane made from grown crystal excluding a region in the vicinity of the seed crystal is $1\times10^4$ cm$^{-2}$ or less and the micropipe density observed therein is 10 cm$^{-2}$ or less.

(10) A single-crystal silicon carbide according to any of (1) to (9), wherein total etch pit density caused by all types of dislocation observed in a wafer of an off-angle of 8° from the {0001} plane made from grown crystal excluding a region in the vicinity of the seed crystal is $5\times10^3$ cm$^{-2}$ or less and the micropipe density observed therein is 5 cm$^{-2}$ or less.

(11) A single-crystal silicon carbide wafer made from grown crystal excluding a region in the vicinity of the seed crystal of the single-crystal silicon carbide according any of (1) to (10), whose diameter is 75 mm to 300 mm and polytype other than in the edge exclusion region is 4H.

Effect of the Invention

The single-crystal SiC of the present invention is low in defects, so that a wafer made from the single crystal is of good quality and exhibits high performance as a wafer for devices.

BRIEF DESCRIPTION OF THE DRAWING

FIG. 1 is a block diagram showing an example of a single crystal growing apparatus used to manufacture the crystal of the present invention.

BEST MODE FOR CARRYING OUT THE INVENTION

The single-crystal silicon carbide of the present invention comprises a seed crystal and a grown crystal grown on the seed crystal and has a region in the vicinity of the seed crystal whose doping element concentration is $2\times10^{19}$ cm$^{-3}$ to $6\times10^{20}$ cm$^{-3}$. Moreover, the ratio of higher to lower doping element concentrations on opposite sides in the direction of crystal growth of the interface between the seed crystal and the grown crystal (concentration of high concentration side crystal/concentration of low concentration side crystal) is held to 5 or less, thereby minimizing micropipe defects and dislocation defects to establish high crystal quality.

The region in the vicinity of the seed crystal is a region in which crystal defects and foreign polytypes occur at a high rate at the initial stage of crystal growth. This invention thoroughly restrains the occurrence of crystal defects to enhance the quality of the grown crystal by keeping the dopant concentration of this region within the specified range.

The dopant concentration of the grown crystal that grows beyond the seed crystal vicinity region can be regulated to meet the requirements of a device or the like. The dopant concentration of the grown crystal that grows beyond the seed crystal vicinity region is not subject to any particular limitation. Although the thickness of the seed crystal vicinity region depends on the growth conditions, one of 0.5 mm or less falls substantially within the range of the ingot machining allowance and, as such, is preferable in the point that the effect on the number of device wafers that can be obtained is negligible. However, a seed crystal vicinity region thinner than 0.05 mm is undesirable because it becomes impossible to cover the region of unstable growth. As the number of wafers that can be cut from the single-crystal SiC of the present invention is the same as can be cut from conventional single-crystal SiC, it is not disadvantageous from the cost aspect.

The ratio of higher to lower doping element concentrations on opposite sides in the direction of crystal growth of the interface between the seed crystal and the grown crystal is preferably 2 or less and more preferably 1.5 or less. Although the ideal concentration ratio is 1 (equal concentration), it is in actual practice impossible to make the concentrations of the seed crystal and grown crystal exactly the same, because of element contamination from the crucible and insulation used during crystal growth and, also, in the case of a solid dopant source, because the efficiency of dopant entrainment by the crystal varies with difference in saturation vapor pressure vis-à-vis the SiC and further with slight fluctuation in the growth temperature. An attempt to establish the ideal concentration ratio of 1 would therefore require, inter alia, use of a crucible fabricated from special high-purity materials and very precise control of the growth process, which would be undesirable from the aspects of productivity and cost. When the ratio is established within the range specified by the present invention, altogether adequate crystal quality is ensured even without making the doping element concentrations on opposite sides of the interface between the seed crystal and grown crystal exactly equal. The doping element concentration in the seed crystal vicinity region of the grown crystal is preferably $5\times10^{19}$ cm$^{-3}$ to $6\times10^{20}$ cm$^{-3}$, and more preferably $1\times10^{20}$ cm$^{-3}$ to $6\times10^{20}$ cm$^{-3}$. When the concentration of the doping element is less than $2\times10^{19}$ cm$^{-3}$, the effect of the present invention cannot be readily achieved, and when it is greater than $6\times10^{20}$ cm$^{-3}$ the probability of polycrystal occurrence becomes undesirably high. For the reason explained earlier, moreover, the concentration of the doping element generally tends to become high at the start of crystal growth. It is therefore difficult to achieve a small concentration ratio between the seed crystal and the grown crystal when the doping element concentration of the seed crystal is low. Establishing the doping element concentration of the seed crystal vicinity region within the range of the present invention is also advantageous from the aspect of minimizing the concentration between opposite sides of the interface in the growth direction.

The doping element can be selected from among nitrogen, boron (B) and aluminum (Al), the ordinary SiC dopants, vanadium (V), which is used to increase the resistivity of the crystal, and the like. Among these, nitrogen is preferable. Nitrogen doping facilitates concentration control because it enables use of a gas source ($N_2$). Moreover, nitrogen doping facilitates nucleation of 4H polytype, which is the most suitable polytype for power devices, and inhibits inclusion of other polytypes.

The present invention can provide high-quality single-crystal SiC of low defect density owing to the following four effects. The first is that at the start of crystal growth when growth tends to be unstable, the present invention has the effect of establishing a dopant concentration in the grown crystal that is higher than the dopant concentration suitable for a wafer for ordinary devices (e.g., nitrogen concentration of $5 \times 10^{18}$ cm$^{-3}$ to less than $2 \times 10^{19}$ cm$^{-3}$), thereby preferentially nucleating the desired polytype and inhibiting inclusion of other polytypes. The second is that by minimizing the difference in doping element concentration at the interface between the seed crystal and the grown crystal, the invention has the effect of inhibiting defects caused by mismatch of lattice constants and other physical properties. The third is that the invention has the effect of minimizing the number of basal plane dislocations occurring at the interface between the seed crystal and grown crystal. And the fourth is that the invention has the effect of reducing the rate of conversion of basal plane dislocations to threading dislocations, so that even if basal plane dislocations occur they do not propagate in the growth direction.

Although the mechanisms of the third and fourth effects are still within the realm of conjecture, the following explanations are considered probable. Regarding the third effect, as is suggested by the fact that a decline in fracture toughness is observed in a crystal heavily doped with impurities, the element doping most likely increases the critical sheer stress. Generation of thermal stress is substantially unavoidable in the modified Lely process, and the increase in critical sheer stress can diminish dislocation occurrence. The fourth effect is probably the result of growth mode change caused by an increase in the C/Si ratio. However, it has been reported regarding epitaxial growth of SiC film on an Si surface that the rate of conversion of basal plane dislocations to threading dislocations increases when the C/Si ratio is high. The phenomenon mentioned as the fourth effect-must therefore be considered in the light of the bulk growth and carbon surface growth. It should be noted that the present invention is not limited by the mechanism of the defect control.

The present invention strongly inhibits the occurrence of defects at the start of crystal growth, which has been a major problem heretofore. This is because only the single-crystal SiC of the present invention is capable of producing the aforesaid four effects simultaneously. And of particular note is that the third and fourth effects were realized for the first time by the present invention.

The seed crystal for growing the single-crystal SiC of the present invention must contain nitrogen at a higher concentration than the nitrogen concentration generally required for device use (e.g., around $5 \times 10^{18}$ cm$^{-3}$ to $1 \times 10^{19}$ cm$^{-3}$). Therefore, when conducting crystal growth to manufacture wafers for device fabrication, nitrogen must be gradually decreased to the desired concentration during the growth. On the other hand, it is sometimes impossible to adapt a crystal manufactured for seed purposes to one for device use. However, crystal production by the modified Lely process must, by nature, be carried out as a self-reproducing cycle including batch growth of seed crystal, so that inclusion in the cycle of a growth process exclusively for seed does not lower productivity or cause other problems.

In the present invention, the etch pit density caused by dislocations observed in a wafer of an off-angle of 8° from the {0001} plane made from grown crystal excluding a region in the vicinity of the seed crystal is $1 \times 10^4$ cm$^{-2}$ or less and the micropipe density observed therein is 10 cm$^{-2}$ or less. Under still more preferable conditions, etch pit density is $5 \times 10^3$ cm$^{-2}$ or less and micropipe density is 5 cm$^{-2}$ or less.

When devices are fabricated on the wafer of this quality, lower leak current than with the conventional wafer and other effects can be anticipated that make the wafer particularly suitable for high-current devices.

Although high quality becomes increasingly difficult to maintain in a single-crystal SiC as the diameter becomes larger, the technology of the present invention is basically independent of the size of the grown crystal and therefore exhibits great effect when applied to large-diameter single crystal enabling fabrication of 76 mm (3 inch) to 300 mm diameter wafers. As the production line already industrially established for conventional semiconductors (Si, GaAs etc.) can be utilized for wafers of 75 mm (3 inch) diameter and larger, the invention wafer is suitable for industrial production, and since the polytype of all except the edge exclusion region can be constituted as 4H, device productivity is high. Note that the edge exclusion region is generally a region up to around 2 mm inward from the outer periphery in the case of a 76 mm (3 inch) diameter wafer and a region up to around 3 mm inward from the outer periphery in the case of a 100 mm diameter wafer. This region is exempted from the quality assurance and is a region not used for device fabrication or the like.

EXAMPLES

The present invention is concretely explained based on examples and comparative examples in the following.

FIG. 1 is a single crystal growing apparatus used in the invention examples and the comparative examples to manufacture crystal by the modified Lely process. Crystal was grown by sublimating sublimation feedstock 2 by induction heating and recrystallizing it on a seed crystal 1. The seed crystal 1 was attached to the inner surface of a graphite cover 4, and the sublimation feedstock 2 was charged into a graphite crucible 3. The graphite crucible 3 and graphite cover 4 were covered with graphite felt 7 for heat shielding and mounted on a graphite support rod 6 inside a double-walled quartz tube 5. The interior of the double-wall quartz tube 5 was evacuated to less than $1.0 \times 10^{-4}$ Pa using a vacuum pumping apparatus 11, whereafter high-purity Ar gas of a purity of 99.9999% or greater was passed through a tube 9 under the control of a gas mass flow controller 10 to maintain the quartz tube internal pressure at 80 Pa while simultaneously passing high-frequency electric current through a work coil 8 to heat the bottom of the graphite crucible to the desired temperature of 2400° C.

Nitrogen gas (N$_2$) was similarly passed into the quartz tube through the tube 9 under the control of the gas mass flow controller 10 to control the nitrogen partial pressure in the atmosphere gas and adjust the concentration of the nitrogen atoms taken into the SiC crystal. Optical paths of 2 to 15 mm diameter were formed in the graphite felt 7 at the top and bottom of the crucible, and measurement of crucible temperature was conducted using two-color pyrometers. The temperature of the crucible top was treated as the seed temperature and that at the bottom as the feedstock temperature. The quartz tube internal pressure was thereafter reduced to the growth pressure of 0.8 kPa to 3.9 kPa over a period of about 15 min and this state was maintained for 60 hr to conduct crystal growth.

Example 1

First, a single-crystal SiC ingot was prepared to obtain a seed crystal for conducting the crystal growth of Example 1.

A 79 mm diameter single-crystal SiC ingot was produced by a growth process using the aforesaid single crystal growing apparatus under conditions such that the nitrogen concentration in the grown crystal was $2.2 \times 10^{19}$ cm$^{-3}$ in the region 1 mm and greater away from the interface with the seed crystal. In order to obtain the desired value of the grown crystal nitrogen concentration, the partial pressure of the nitrogen gas in the atmosphere was controlled to 100 Pa from the time that the grown crystal was estimated to have reached 1 mm up to the end of growth, and the value of the partial pressure of the nitrogen gas at the start of growth was determined with consideration to the nitrogen concentration and the like of the seed crystal. Next, the so-obtained single-crystal SiC ingot to be used for seed crystals was machined to fabricate a number of 77 mm diameter wafers of an off-angle of 8° from the {0001} plane. Both sides of the wafers were polished. Next, for the purpose of evaluating dislocation density, one of the wafers was etched with molten KOH at about 530° C., and the etch pits were observed. The densities of the etch pits corresponding to threading dislocations and basal plane dislocations were found to be $2.1 \times 10^4$ $cm^{-2}$ and $4.9 \times 10^3$ $cm^{-2}$, respectively, and the total etch pit density caused by dislocations was $2.6 \times 10^4$ $cm^{-2}$. The etch pitch density caused by micropipes was 1.7 $cm^{-2}$.

One of the remaining wafers was used as a seed crystal to grow the single-crystal SiC of Example 1 by the process using the aforesaid single crystal growing apparatus. The partial pressure of the nitrogen gas set at 180 Pa at the start of growth was maintained for 12 hr. The nitrogen concentration was then adjusted to that suitable for a wafer for devices ($5 \times 10^{18}$ $cm^{-3}$ to less than $2 \times 10^{19}$ $cm^{-3}$) by gradually reducing it from 180 Pa to 65 Pa over 8 hr, whereafter it was controlled to a constant value of 65 Pa up to the end of the growth.

The single-crystal SiC ingot obtained in this manner measured 79 mm in diameter and about 30 mm in height. Analysis by X-ray diffraction and Raman scattering confirmed growth of 4H polytype. The nitrogen concentration of the grown crystal in the vicinity of the seed crystal was analyzed by cutting from the initial growth portion a test piece having a surface parallel to the growth direction of the ingot and measuring it by secondary ion mass spectrometry (SIMS). The nitrogen concentration at the interface between the seed crystal and grown crystal was $2.2 \times 10^{19}$ $cm^{-3}$ on the seed crystal side and $4.5 \times 10^{19}$ $cm^{-3}$ on the grown crystal side. The ratio of higher to lower doping element concentrations on opposite sides of the interface in the growth direction (nitrogen concentration ratio) was therefore $4.5 \times 10^{19}$ $cm^{-3}/2.2 \times 10^{19}$ $cm^{-3}=2.05$.

As the nitrogen concentration of the grown crystal of the region up to 0.35 mm from the interface with the seed crystal was approximately as stated above ($2.2 \times 10^{19}$ $cm^{-3}$), this region was the seed crystal vicinity region.

The dislocation density of the grown crystal was measured by preparing from the later-grown portion excluding the seed crystal vicinity region a 77 mm diameter wafer of an off-angle of 8° from the {0001} plane, polishing it, and then observing the etch pits. The etch pit densities corresponding to threading dislocations and basal plane dislocations were $5.7 \times 10^3$ $cm^{-2}$ and $2.4 \times 10^3$ $cm^{-2}$, respectively, and the total etch pit density caused by dislocations was $8.1 \times 10^3$ $cm^{-2}$. The etch pitch density caused by micropipes was 1.7 $cm^{-2}$.

Visual observation of the color of the prepared wafers confirmed that the wafers, including the edge exclusion regions, consisted solely of 4H polytype.

Example 2

In order to prepare a seed crystal for conducting the crystal growth of Example 2 by a growth process using the aforesaid single crystal growing apparatus, a 103 mm diameter single-crystal SIC ingot was produced wherein the nitrogen concentration in the grown crystal was $5.1 \times 10^{19}$ $cm^{-3}$ in the region 2 mm and greater from the interface with the seed crystal. In this case, the nitrogen gas partial pressure was controlled to 230 Pa except at the start of growth. The ingot was machined to fabricate a number of 101 mm diameter wafers of an off-angle of 8° from the {0001} plane. Both sides of the wafers were polished, and one of the wafers was observed for etch pits. The densities of the etch pits corresponding to threading dislocations and basal plane dislocations were $6.8 \times 10^3$ $cm^{-2}$ and $1.8 \times 10^3$ $cm^{-2}$, respectively, and the total etch pit density caused by all types of dislocation was $8.6 \times 10^3$ $cm^{-2}$. The etch pitch density caused by micropipes was 1.1 $cm^{-2}$.

One of the remaining wafers was used as a seed crystal to grow the single-crystal SiC of Example 2 by the process using the aforesaid single crystal growing apparatus. The nitrogen concentration was adjusted to that suitable for a wafer for devices ($5 \times 10^{18}$ $cm^{-3}$ to less than $2 \times 10^{19}$ $cm^{-3}$) by controlling the nitrogen gas partial pressure to a constant value of 260 Pa from the start to the end of the growth.

The single-crystal SiC ingot obtained in this manner measured 103 mm in diameter and about 25 mm in height. Analysis by X-ray diffraction and Raman scattering confirmed growth of 4H polytype. The nitrogen concentration of the crystal was measured by SIMS using a test piece cut from the initial growth portion of the ingot to have a surface parallel to the growth direction.

The nitrogen concentration at the grown crystal interface was $5.1 \times 10^{19}$ $cm^{-3}$ on the seed crystal side and $6.3 \times 10^{19}$ $cm^{-3}$ on the grown crystal side. The ratio of higher to lower doping element concentrations on opposite sides of the interface in the growth direction (nitrogen concentration ratio) was therefore $6.3 \times 10^{19}$ $cm^{-3}/5.1 \times 10^{19}$ $cm^{-3}=1.23$.

As the nitrogen concentration of the grown crystal of the region up to 0.5 mm from the interface with the seed crystal was approximately as stated above ($5.1 \times 10^{19}$ $cm^{-3}$), this region was the seed crystal vicinity region.

A 101 mm diameter wafer of an off-angle of 8° from the {0001} plane was prepared from the later-grown portion excluding the seed crystal vicinity region and polished. Visual observation of the color of the obtained wafers showed that the wafers, including the edge exclusion regions, consisted solely of 4H polytype.

One of the wafers was observed for etch pit density. The etch pit densities corresponding to threading dislocations and basal plane dislocations were $5.3 \times 10^3$ $cm^{-2}$ and $1.1 \times 10^3$ $cm^{-2}$, respectively, and the total etch pit density caused by all types of dislocation was $6.4 \times 10^3$ $cm^{-2}$. The etch pitch density caused by micropipes was 0.9 $cm^{-2}$.

Example 3

A 79 mm diameter single-crystal SiC ingot for use as seed crystal was produced as in Example 1. Except at the start of growth, the nitrogen gas partial pressure was controlled to 1 kPa so as to make the nitrogen concentration in the grown crystal was $2.0 \times 10^{20}$ $cm^{-3}$ in the region 1 mm from the seed crystal.

The ingot was machined to fabricate a number of 77 mm diameter wafers of an off-angle of 8° from the {0001} plane. Both sides of the wafers were polished, and one of the wafers was observed for etch pits. The densities of the etch pits corresponding to threading dislocations and basal plane dislocations were $5.6 \times 10^3$ $cm^{-2}$ and $1.1 \times 10^3$ $cm^{-2}$, respectively, and the total etch pit density caused by all types of dislocation was $6.7 \times 10^3$ $cm^{-2}$. The etch pitch density caused by micropipes was 0.06 $cm^{-2}$.

One of the remaining wafers was used as a seed crystal to grow the single-crystal SiC of Example 3 by the process using the aforesaid single crystal growing apparatus.

The nitrogen gas partial pressure set at 900 Pa at the start of growth was maintained for 12 hr. Then, in order to establish a carrier concentration suitable for a wafer for devices (nitrogen concentration ($5 \times 10^{18}$ cm$^{-3}$ to less than $2 \times 10^{19}$ cm$^{-3}$)), the nitrogen partial pressure was gradually reduced to 70 Pa over 10 hr and thereafter controlled to a constant value of 70 Pa from a point in the course of growth up to the end of the growth.

The single-crystal SiC ingot obtained in this manner measured 79 mm in diameter and about 29 mm in height. Analysis by X-ray diffraction and Raman scattering confirmed growth of 4H polytype crystal.

The nitrogen concentration of the crystal was measured by SIMS using a test piece cut from the initial growth portion of the ingot to have a surface parallel to the growth direction. The nitrogen concentration at the grown crystal interface was $2.0 \times 10^{20}$ cm$^{-3}$ on the seed crystal side and $1.9 \times 10^{20}$ cm$^{-3}$ on the grown crystal side. The ratio of higher to lower doping element concentrations on opposite sides of the interface in the growth direction (nitrogen concentration ratio) was therefore $2.0 \times 10^{20}$ cm$^{-3}$/$1.9 \times 10^{20}$ cm$^{-3}$=1.05.

As the nitrogen concentration of the grown crystal of the region up to 0.6 mm from the interface with the seed crystal was approximately as stated above ($2.0 \times 10^{20}$ cm$^{-3}$), the seed crystal vicinity region in Example 3 was this 0.6 mm region.

A 77 mm diameter wafer of an off-angle of 8° from the {0001} plane was prepared from the later-grown portion excluding the seed crystal vicinity region and polished. Visual observation of the color of the obtained wafer showed that the prepared wafer, including the edge exclusion region, consisted solely of 4H polytype.

One of the wafers was polished and observed for etch pits. The etch pit densities corresponding to threading dislocations and basal plane dislocations were $2.3 \times 10^3$ cm$^{-2}$ and $0.7 \times 10^3$ cm$^{-2}$, respectively, and the total etch pit density caused by all types of dislocation was $3.0 \times 10^3$ cm$^{-2}$. The etch pitch density caused by micropipes was 0.02 cm$^{-2}$.

Further, a 75.2 mm (3 inch) diameter wafer of an off-angle of 8° from the {0001} plane was prepared from the later-grown portion of the single-crystal SiC ingot excluding the seed crystal vicinity region, polished to a mirror-finish wafer with diamond abrasive grains, and homoepitaxial growth was performed on the Si plane.

The epitaxial growth conditions were: growth temperature of 1550° C., and flow rates of silane (SiH$_4$), propane (C$_3$H$_8$) and hydrogen (H$_2$) of 32 cc/min, 21 cc/min and 150 L/min, respectively. An approximately 5 µm activation layer was grown by regulating the nitrogen gas flow rate to obtain a carrier concentration of $1 \times 10^{16}$ cm$^{-3}$ at the activation layer. A MOSFET structure was fabricated on the epitaxial substrate produced in this manner. The breakdown voltage of the gate insulating film was measured and found to be about 800 V.

Comparative Example 1

Prior to comparative example testing, a 79 mm diameter single-crystal SiC ingot was produced beforehand similarly to in the Examples for use in seed crystal preparation. The nitrogen partial pressure was controlled to 65 Pa from a point in the course of growth up to the end of the growth to establish a nitrogen concentration of $1.4 \times 10^{19}$ cm$^{-3}$ in the region of the crystal that grew beyond 2 mm from the seed crystal.

The ingot was machined similarly to in the foregoing Examples to fabricate a number of 77 mm diameter wafers of an off-angle of 8° from the {0001} plane. Both sides of the wafers were polished. The dislocation densities of the wafers were assessed as in the foregoing Examples. The densities of the etch pits corresponding to threading dislocations and basal plane dislocations were $1.3 \times 10^4$ cm$^{-2}$ and $3.2 \times 10^3$ cm$^{-2}$, respectively, and the total etch pit density caused by all types of dislocation was $1.6 \times 10^4$ cm$^{-2}$. The etch pitch density caused by micropipes was 2.1 cm$^{-2}$.

One of the prepared wafers was used as a seed crystal to conduct the single-crystal SiC growth of Comparative Example 1 by the process using the aforesaid single crystal growing apparatus. As for the dopant concentration, with the aim of establishing a nitrogen concentration suitable for a wafer for devices ($5 \times 10^{18}$ cm$^{-3}$ to less than $2 \times 10^{19}$ cm$^{-3}$), the nitrogen gas partial pressure was held constant at 900 kPa from the start to the end of growth.

The single-crystal SiC ingot obtained in this manner measured 79 mm in diameter and about 24 mm in height. Analysis by X-ray diffraction and Raman scattering confirmed prevalence of 4H polytype. Nitrogen concentration was measured by SIMS using a test piece cut from the initial growth portion of the ingot to have a surface parallel to the growth direction. The nitrogen concentration at the interface between the seed crystal and grown crystal was $1.4 \times 10^{19}$ cm$^{-3}$ on the seed crystal side and $1.9 \times 10^{20}$ cm$^{-3}$ in the region of the grown crystal in the vicinity of the seed crystal. The ratio of higher to lower doping element concentrations on opposite sides of the interface in the growth direction (nitrogen concentration ratio) was therefore $1.9 \times 10^{20}$ cm$^{-3}$/$1.4 \times 10^{19}$ cm$^{-3}$=13.5

A transmission image taken with a light microscope revealed polycrystalline nucleation of 3C polytype SiC at the interface between the seed crystal and growth crystal. The occurrence of polycrystal was concluded to be the result of a mismatch of physical properties between the seed crystal and grown crystal caused by the big difference in nitrogen concentration.

A 79 mm diameter wafer of an off-angle of 8° from the {0001} plane was prepared from the later-grown portion excluding the seed crystal vicinity region, polished, and observed for etch pits. The etch pit densities corresponding to threading dislocations and basal plane dislocations were $3.7 \times 10^5$ cm$^{-2}$ and $1.2 \times 10^4$ cm$^{-2}$, respectively, and the total etch pit density caused by all types of dislocation was $3.8 \times 10^5$ cm$^{-2}$. The etch pitch density caused by micropipes was 38.2 cm$^{-2}$. The dislocation density was high over substantially the entire substrate surface, and the micropipes were generated mostly from polycrystal nuclei as starting points.

Visual observation of the color of the prepared wafer confirmed that the polytype of the wafer, excluding the edge exclusion regions, was mainly 4H polytype but that 3C polytype was also present.

Comparative Example 2

A seed crystal machined from an ingot like the one prepared beforehand for use as seed crystal in Comparative Example 1 was used as a seed crystal to conduct the single-crystal SiC growth of Comparative Example 2 by the process using the aforesaid single crystal growing apparatus. As for the dopant concentration, with the aim of establishing a nitrogen concentration suitable for a wafer for devices ($5 \times 10^{18}$ cm$^{-3}$ to less than $2 \times 10^{19}$ cm$^{-3}$), the nitrogen gas partial pressure was set at 30 Pa at the start of growth, then gradually increased to 65 Pa over 6 hr, and thereafter held constant at 65 Pa up to the end of the growth.

The single-crystal SiC ingot obtained in this manner measured 79 mm in diameter and about 33 mm in height. Analysis by X-ray diffraction and Raman scattering confirmed presence of the three polytypes 4H, 6H and 15R.

Nitrogen concentration was measured by SIMS using a test piece cut from the initial growth portion of the ingot to have a surface perpendicular to the growth direction. The nitrogen concentration at the grown crystal interface was $1.4 \times 10^{19}$ cm$^{-3}$ on the seed crystal side and $1.2 \times 10^{19}$ cm$^{-3}$ in the region of the grown crystal in the vicinity of the seed crystal. The ratio of higher to lower doping element concentrations on opposite sides of the interface in the growth direction (nitrogen concentration ratio) was therefore $1.4 \times 10^{19}$ cm$^{-3}$/$1.2 \times 10^{19}$ cm$^{-3}$=1.17.

A transmission image taken with a light microscope revealed that a mixture of the three polytypes 4H, 6H and 15R was produced in the initially grown crystal in the vicinity of the seed crystal. The low nitrogen concentration of $1.2 \times 10^{19}$ cm$^{-3}$ in the seed crystal vicinity region of the grown crystal during the initial growth period when the growth tends to be unstable is thought to have caused formation of foreign polytype nuclei other than 4H that were carried over until the end of growth.

A 79 mm diameter wafer of an off-angle of 8° from the {0001} plane was prepared from the later-grown portion excluding the seed crystal vicinity region, polished, and observed for etch pits. The etch pit densities corresponding to threading dislocations and basal plane dislocations were $6.6 \times 10^4$ cm$^{-2}$ and $0.9 \times 10^4$ cm$^{-2}$, respectively, and the total etch pit density caused by all types of dislocation was $7.5 \times 10^4$ cm$^{-2}$. The etch pitch density caused by micropipes was 81.5 cm$^{-2}$. The micropipes occurred mainly at the foreign polytype interfaces. Even though the polytype interfaces disappeared in the course of growth, the micropipes remained in the crystal grown thereafter. Although dislocations were present at high density throughout the substrate, their density was particularly high around the micropipes.

Visual observation of the color of the prepared wafer confirmed that the polytype of the wafer, excluding the edge exclusion region, was mainly 4H polytype but numerous patches of 6H and 15R polytype were included particularly at the wafer peripheral region.

A 75.2 mm (3 inch) diameter wafer of an off-angle of 8° from the {0001} plane was prepared from the later-grown portion of the single-crystal SiC ingot excluding the seed crystal vicinity region of Comparative Example 2 and polished to a mirror-finish wafer with diamond abrasive grains, and homoepitaxial growth was performed on the Si plane. The epitaxial growth conditions were the same as those in Example 3.

A MOSFET structure was fabricated on the produced epitaxial substrate. As the epitaxial substrate included foreign polytypes other than 4H, the MOSFET structure was fabricated at a 4H polytype portion selected as a region low in micropipes. The breakdown voltage of the gate insulating film was measured and found to be about 340 V.

EXPLANATION OF REFERENCE SYMBOLS

1 Seed crystal (single-crystal SiC)
2 Sublimation feedstock
3 Graphite crucible
4 Graphite cover
5 Double-walled quartz tube
6 Support rod
7 Graphite felt
8 Work coil
9 Gas tube
10 Gas mass flow controller
11 Vacuum pumping apparatus

What is claimed is:

1. A single-crystal silicon carbide manufactured by the modified Lely process, comprising:
    a seed crystal, wherein nitrogen concentration of the seed crystal is greater than $1 \times 10^{19}$ cm$^{-3}$; and
    a grown crystal grown on the seed crystal, wherein doping element concentration of the grown crystal at least in a region in the vicinity of the seed crystal is $2 \times 10^{19}$ cm$^{-3}$ to $6 \times 10^{20}$ cm$^{-3}$ and a ratio of higher to lower doping element concentrations on opposite sides of an interface between the seed crystal and the grown crystal (concentration of high concentration side crystal/concentration of low concentration side crystal) is from 1.05 to 5.

2. A single-crystal silicon carbide according to claim 1, wherein the region in the vicinity of the seed crystal is a region of 0.5 mm or less thickness on the grown crystal side of the interface between the seed crystal and the grown crystal.

3. A single-crystal silicon carbide according to claim 1, wherein the ratio of higher to lower doping element concentrations is from 1.05 to 2.

4. A single-crystal silicon carbide according to claim 1, wherein the ratio of higher to lower doping element concentrations is from 1.05 to 1.5.

5. A single-crystal silicon carbide according to claim 1, wherein the doping element concentration of the grown crystal in a region in the vicinity of the seed crystal is $5 \times 10^{19}$ cm$^{-3}$ to $6 \times 10^{20}$ cm$^{-3}$.

6. A single-crystal silicon carbide according to claim 1, wherein the doping element concentration of the grown crystal in a region in the vicinity of the seed crystal is $1 \times 10^{20}$ cm$^{-3}$ to $6 \times 10^{20}$ cm$^{-3}$.

7. A single-crystal silicon carbide according to claim 1, wherein the doping element is nitrogen.

8. A single-crystal silicon carbide according to claim 1, wherein the principal polytype is 4H.

9. A single-crystal silicon carbide according to claim 1, wherein total etch pit density caused by all types of dislocation observed in a wafer of an off-angle of 8° from the {0001} plane made from grown crystal excluding a region in the vicinity of the seed crystal is $1 \times 10^4$ cm$^{-2}$ or less and the micropipe density observed therein is 10 cm$^{-2}$ or less.

10. A single-crystal silicon carbide according to claim 1, wherein total etch pit density caused by all types of dislocation observed in a wafer of an off-angle of 8° from the {0001} plane made from grown crystal excluding a region in the vicinity of the seed crystal is $5 \times 10^3$ cm$^{-2}$ or less and the micropipe density observed therein is 5 cm$^{-2}$ or less.

11. A single-crystal silicon carbide wafer made from grown crystal excluding a region in the vicinity of the seed crystal of the single-crystal silicon carbide according to claim 1, whose diameter is 75 mm to 300 mm and polytype other than in the edge exclusion region is 4H.

* * * * *